United States Patent [19]
Mochizuki

[11] Patent Number: 4,837,476
[45] Date of Patent: Jun. 6, 1989

[54] SURFACE ACOUSTIC WAVE RESONATOR HAVING TRANSDUCERS AND REFLECTORS OF DIFFERENT PERIODS

[75] Inventor: Masami Mochizuki, Yamanashi, Japan

[73] Assignee: Pioneer Electronic Corporation, Tokyo, Japan

[21] Appl. No.: 856,317

[22] Filed: Apr. 28, 1986

[30] Foreign Application Priority Data

Apr. 27, 1985 [JP] Japan ............................ 60-91642

[51] Int. Cl.$^4$ ............................................. H01L 41/08
[52] U.S. Cl. ............................... 310/313 R; 310/313 D; 310/312; 333/153; 333/195
[58] Field of Search .............. 310/313 R, 312, 313 A, 310/313 B, 313 C, 313 D; 333/150–155, 193–196

[56] References Cited

U.S. PATENT DOCUMENTS

| | | | |
|---|---|---|---|
| 3,883,831 | 5/1975 | Williamson et al. | 310/313 D X |
| 3,886,504 | 5/1975 | Hartmann et al. | 310/313 D X |
| 4,065,735 | 12/1977 | Palfreeman et al. | 310/313 D X |
| 4,155,057 | 5/1979 | Sandy et al. | 310/313 D X |
| 4,243,960 | 1/1981 | White | 310/313 R |
| 4,425,554 | 1/1984 | Morishita et al. | 310/313 D X |
| 4,427,956 | 1/1984 | Murray et al. | 310/313 D X |
| 4,472,652 | 9/1984 | Brice et al. | 310/313 B |
| 4,617,487 | 10/1986 | Sone et al. | 310/313 D |
| 4,635,009 | 1/1987 | Ebata | 310/313 D X |

FOREIGN PATENT DOCUMENTS

| | | | |
|---|---|---|---|
| 0139010 | 7/1985 | Japan | 333/195 |
| 0149214 | 8/1985 | Japan | 333/195 |

*Primary Examiner*—Mark O. Budd
*Attorney, Agent, or Firm*—Sughrue, Mion, Zinn, Macpeak and Seas

[57] ABSTRACT

A surface acoustic wave resonator comprising at least two interdigital electro-acoustic transducers found between two sets of reflective gratings on a crystalline substrate. The period of the electrodes of the transducers is selected to be less than the period of the reflective gratings.

4 Claims, 3 Drawing Sheets

SURFACE ACOUSTIC WAVE RESONATOR HAVING TRANSDUCERS AND REFLECTORS OF DIFFERENT PERIODS

BACKGROUND

1. Field of the Invention

The present invention relates to surface acoustic wave resonators and particularly to a surface acoustic wave resonator which is small in size, which is low in losses, and which has a high Q and a reduced spurious response.

2. Background Art

Generally, a surface acoustic wave resonator is arranged such that, as shown in FIG. 1, interdigital transducers (hereafter abbreviated as IDTs) 2 and 3, made of an electrically conductive material such as aluminum (A1), and reflectors 4 and 5 are formed on a crystalline substrate 1. The interdigital nature of the transducers is better shown in FIG. 4. An input electrical signal is converted by the input IDT 2 into a surface acoustic wave. The surface acoustic wave oscillates between the reflectors 4 and 5 to provide a resonance which in turn is coupled to an external circuit through the output IDT 3. Such a so-called cavity resonator as described above is widely used.

The IDTs 2 and 3 and the reflectors 4 and 5 are generally made of the same electrically conductive material, resulting in an advantage that only one patterning step will suffice. It is known there is such a relationship of frequency characteristics as shown in FIG. 2 between the reflection coefficient $|\Gamma|$ and the radiation conductance Ga of the IDT.

On the other hand, there have been a number of reports as to resonators having a reflector structure of the group type in which IDTs are made of ordinary electrically conductive material and reflectors are formed with grooves on their crystalline substrates by a dry etching technique.

In the former case, the peak frequency $f_R$ of the reflection coefficient $|\Gamma|$ and the peak frequency $f_T$ of the reflection conductance Ga are not coincident with each other but they are related to each other by the following inequality:

$$f_T > f_R$$

FIG. 3 shows a typical example of this characteristic.

In this case, there have been such disadvantages that a maximum resonance frequency $f_o$ exists on the low frequency side of a stop band (SB) of a reflector, the sharpness of the resonance Q is degraded (the Q sharpness varies with its maximum value), the level difference between the resonance peak and the second peak, that is, a so-called suprious response (hereafter abbreviated to SR), is also small, and so on. Here SR is a positive value so that a high SR corresponds to a reduced spurious response. These disadvantages are caused, as seen from FIG. 2, by the fact that the radiation conductance Ga of the IDT is lower at the frequency $f_R$ than the maximum value thereof and the characteristics of the IDT are not sufficiently adequately used. In order to obtain a resonator having a high Q value with the same structure, it is necessary to increase the number of gratings of the reflector, resulting in a limit in miniaturization.

In the grooved structure, on the other hand, there is an advantage that the reflection coefficient $|\Gamma|$ for each reflector increases and resonance characteristics equivalent to those of the ungrooved structure can be obtained with a smaller number of reflectors than that in the ungrooved case.

There is a disadvantage in the grooved structure, however, in that in order to make the reflector have a grooved structure, the patterning process becomes complicated, resulting in poor mass production.

These and other objects, advantages, and features of the present invention will become more apparent as the description proceeds, when considered with the accompanying drawings.

SUMMARY OF THE INVENTION

It is therefore an object of the present invention to eliminate the disadvantages in the prior art.

In particular, it is an object to provide a surface acoustic wave resonator, which is made small in size, low in loss, and high in Q and in suppression of spurious response, by making IDTs and reflectors of the same electrically conductive material with the same film thickness.

In order to attain the above-mentioned object, the surface acoustic resonator according to the present invention comprises an electro-acoustic transducer and is composed of a pair of surface wave reflectors formed on a crystalline substrate and each composed of a plurality of reflection gratings. A plurality of interdigital transducers are provided between the pair of reflectors, in which a cut angle $\theta$ of a crystal rotation Y plane is selected to be $32° \leq \theta \leq 38°$. An aluminum film having a thickness not larger than 100 nm is used as a material for the interdigital transducers and the reflectors, and the period $L_T$ of the electrodes of the interdigital transducer and the period $L_R$ of the reflectors are selected so as to make the ratio $L_T/L_R$ smaller than 1.0.

DESCRIPTION OF THE PREFERRED EMBODIMENTS

Figure 1:
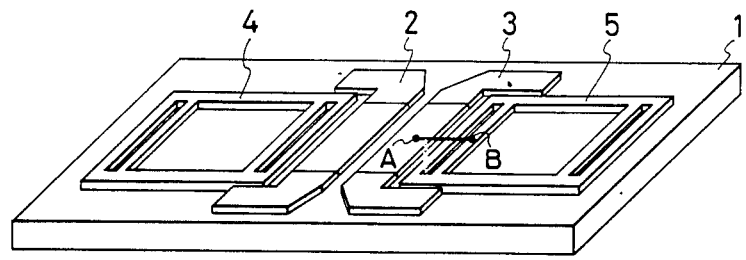
FIG. 1 is a perspective view of the conventional surface acoustic wave resonator.
Figure 2:
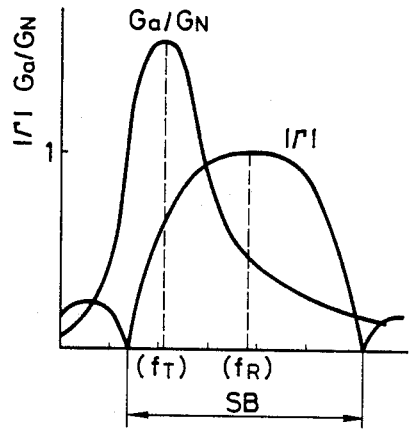
FIG. 2 is a diagram showing the frequency characteristics of the resonance conductance Ga of the IDT and the reflection coefficient of the reflector in the surface acoustic resonator shown in FIG. 1.
Figure 3:
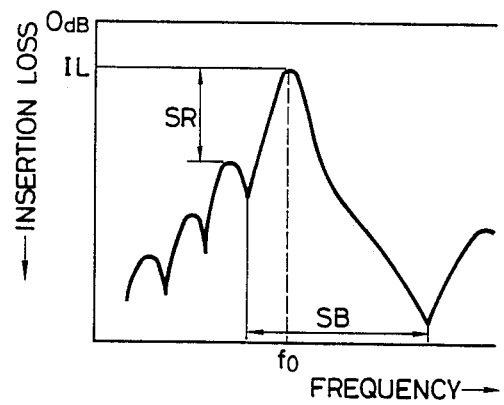
FIG. 3 is a diagram of an example of the characteristics of the conventional surface acoustic resonator.

Referring to the drawings, an embodiment of the present invention will be described hereunder.

Figure 4:
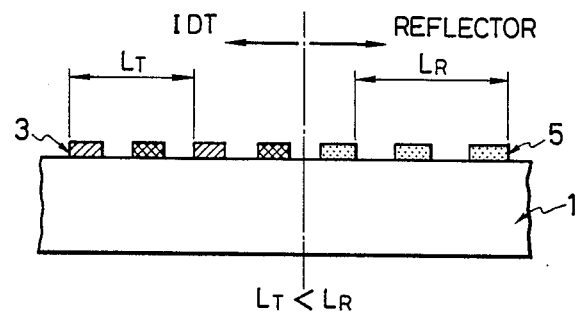
FIG. 4 shows an embodiment of the surface acoustic wave resonator according to the present invention. The view is a section corresponding to the cross-section along the line A-B in FIG. 1.

FIG. 4 is a cross-section taken along the line A-B in FIG. 1. In FIG. 4, $L_T$ and $L_R$ represent the respective periods of IDTs 3 and the gratings of the reflector 5.

Although the period $L_T$ of the IDTs was selected to be equal to the period $L_R$ of the gratings of the reflector in the conventional case, according to the present invention, the ratio $L_T/L_R$ is selected to be a value smaller than 1 (one) so as to cause the frequency $f_R$ at which the reflection coefficient $|\Gamma|$ is a maximum to be close to the frequency $f_T$ at which the radiation conductance Ga is a maximum. Thereby, the excitation and reception efficiency of the surface acoustic wave between the IDTs and reflectors is increased.

Further, according to the present invention, aluminum (Al) is used as the electrically conductive material. Aluminum is light in mass and may be easily etched. The film thickness is selected to be a value not larger than 100 nm in order to improve the etching accuracy to thereby prevent the values of SR and Q from being reduced owing to the influence of a mass effect due to the increase in film thickness. The mass effect arises from bulk-wave conversion at the ends of the IDTs 2 and 3 and of the reflectors 4 and 5 and from multipath reflections between the electrodes.

Figure 5:
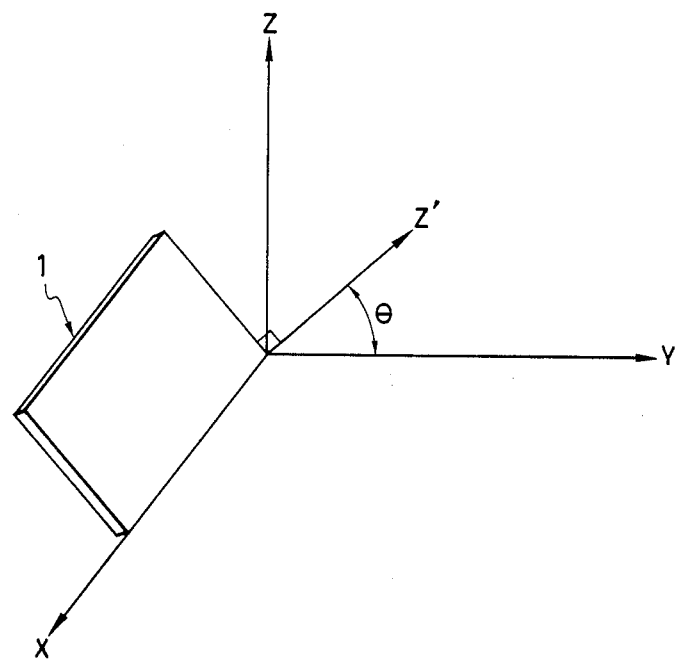
FIG. 5 is a view showing an angular relationship between the crystal axis of the crystalline substrate and the cut surface.

Further, the cut angle $\theta$ of the rotation Y plane of the crystalline substrate 1 (which is composed of single crystal silicon dioxide) is set to within the range of 32–38 degrees such that the temperature-dependent variations in peak frequency of the resonator are minimized in the vicinity at room temperature. FIG. 5 shows the angular relationship between the crystal axis and the normal line Z' of the cut surface of the crystalline substrate 1.

The functions of the resonator according to the present invention will now be described.

Figure 6:
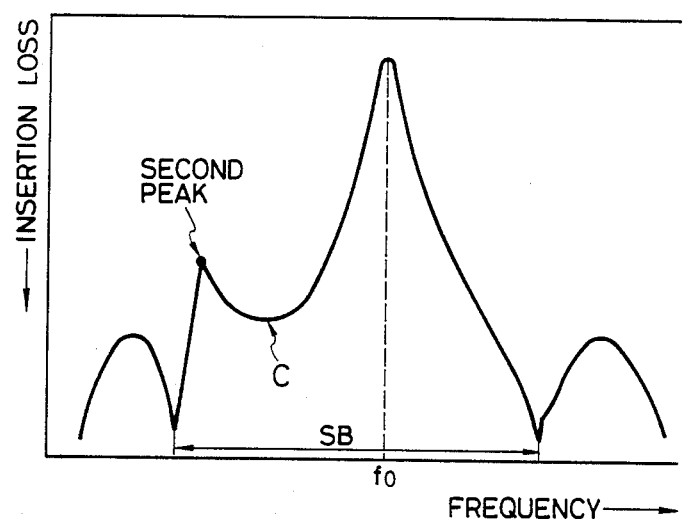
FIGS. 6 and 7 are characteristic diagrams of the embodiment of the surface acoustic wave resonator according to the present invention.

If the ratio $L_T/L_R$ between the period $L_T$ of the IDTs and the period $L_R$ of the gratings of the reflector is decreased gradually from 1 (one), the above-mentioned values $f_T$ and $f_R$ approach each other and the coupling between the IDTs 2 and the reflectors 4 and 5 becomes stronger, so that the insertion losses are decreased and the values of SR and Q are increased. FIG. 6 shows the results of this embodiment, in which the resonance peak frequency $f_o$ exists at a center portion of the stop band SB of the reflector. It is thus possible to obtain values of SR and Q which are, respectively, two times and about one and a half times higher than those in the conventional resonator shown in FIG. 1.

Figure 7:
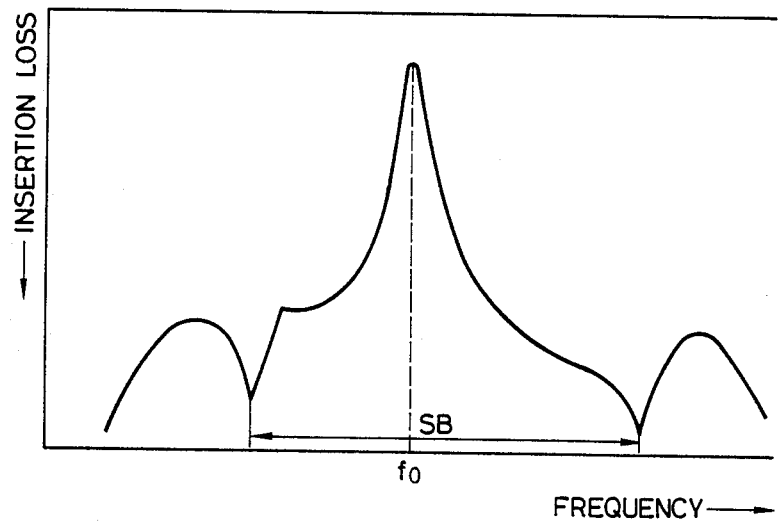

There exists a point of the maximal value C of the insertion loss at a frequency between the resonance peak and the second peak. If the ratio $L_T/L_R$ is selected to make the maximal point coincide with the low frequency end of the stop band SB of the reflector, it is possible to realize a resonator in which SR is further improved. FIG. 7 shows this embodiment, in which the SR is two and a half times higher than that in the conventional resonator.

A preferred example is to select the ratio $L_T/L_R$ to be 0.996 where the period $L_T$ is 1.1587 and the period $L_R$ is 1.1625 under the condition that the central frequency is 674 MHz and the cut angle $\theta$ is 32 degrees. This method is advantageous in that, in manufacturing resonators, it is possible to form IDTs and reflectors by using the same electrically conductive material (Al), it is possible to perform patterning of both elements in one and the same step, it is possible to obtain good resonator characteristics only by changing the pattern dimensions in varying the ratio, $(L_T/L_R)$, and so on.

The present invention can be applied to the case where the cut angle $\theta$ of the crystalline substrate or the thickness of aluminum film is changed to displace the apex temperature (the temperature at which the temperature coefficient is zero) of the resonator to a desired temperature, and to the case where the resonance peak frequency is shifted.

Although the above embodiments have described the case where the ratio of the period $L_T$ of the IDTs and the period $L_R$ of the gratings of the reflector is varied, it is possible to obtain the same effects as those in the above embodiments by changing the velocity of the surface acoustic wave propagating between the IDT section and the reflector section with the ratio of the structural periods $L_T/L_R$ maintained at 1 (one). For example, the apparent ratio $L_T/L_R$ can be made smaller than 1 (one) by coating only the IDT section with $Al_2O_3$ to increase the velocity of the surface acoustic wave propagating in the IDT section or by coating only the reflector section with $SiO_2$ to decrease the velocity of surface acoustic wave.

In view of the above, the term spatial propagation period will be introduced, which denotes the time period during which a propagating wave encounters successive electrodes, that is $t = L/v$ where t is the spatial propagation period, L is the structural period and v is the velocity. In the present invention, the ratio of the spatial propagation periods in the IDTs and the reflectors is important. If the velocity is a constant factor, then this ratio depends only on the structural period. If the structural period is a constant but the velocities vary, then this ratio depends on the velocity ratio. Of course, both the structural period and the velocity can be varied.

As described above, according to the present invention, the IDTs and the reflectors are formed of the same electrically conductive material so that the resonator can be produced in one patterning step. The components of the resonator are simple in structure in comparison with those of the groove reflection type resonator so that error margins in manufacturing can be reduced.

Further, by selecting the thickness of the aluminum film to be 100 nm, the interior characteristics of the substrate can be made uniform, and by setting the ratio $L_T/L_R$ of the period $L_T$ of the IDTs and the period of the gratings of the reflector to a value smaller than 1 (one), it is made possible to increase the surface acoustic wave conversion efficiency between the IDTs and the reflectors to realize a resonator which is low in losses and high in Q as well as in SR, to significantly improve the manufacturing margin with respect to characteristics, and to miniaturize the components.

I claim:

1. A surface acoustic wave resonator, comprising:
   a substrate of a crystal;
   a pair of surface wave reflectors formed on a crystal surface of said substrate and each comprising a plurality of reflection gratings;
   a plurality of electro-acoustic interdigital transducers formed on said substrate surface between said pair of reflectors and each having a plurality of electrodes; and
   a film covering only said pair of reflectors or only said plurality of transducers, thereby providing different propagation velocities,
   wherein a spatial propagation period $L_{T1}$ of said electrodes of said interdigital transducers and a spatial propagation period $L_{R1}$ of said gratings of said reflectors have values having a ratio $L_{T1}/L_{R1}$ less than one.

2. A resonator as recited in claim 1, wherein said film comprises aluminum oxide and covers said plurality of transducers.

3. A resonator as recited in claim 1, wherein said film comprises silicon oxide and covers said pair of reflectors.

4. A resonator as recited in claim 1, wherein said film is an insulator uniformly covering either said pair of reflectors or said plurality of conductors.

* * * * *